(12) United States Patent
Wakaoka et al.

(10) Patent No.: US 11,340,022 B2
(45) Date of Patent: May 24, 2022

(54) VAPOR CHAMBER HAVING PILLARS WITH DECREASING CROSS-SECTIONAL AREA

(71) Applicant: Murata Manufacturing Co., Ltd., Nagaokakyo (JP)

(72) Inventors: Takuo Wakaoka, Nagaokakyo (JP); Shuji Matsumoto, Nagaokakyo (JP); Takayoshi Obata, Nagaokakyo (JP); Norikazu Kume, Nagaokakyo (JP); Haruhiko Ikeda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 181 days.

(21) Appl. No.: 16/655,349

(22) Filed: Oct. 17, 2019

(65) Prior Publication Data

US 2020/0049421 A1 Feb. 13, 2020

Related U.S. Application Data

(63) Continuation of application No. PCT/JP2018/016937, filed on Apr. 26, 2018, and a
(Continued)

(30) Foreign Application Priority Data

Apr. 28, 2017 (JP) .................... PCT/JP2017/017076

(51) Int. Cl.
*F28D 15/00* (2006.01)
*F28D 15/04* (2006.01)
*H05K 7/20* (2006.01)

(52) U.S. Cl.
CPC ......... *F28D 15/04* (2013.01); *H05K 7/20336* (2013.01)

(58) Field of Classification Search
CPC ........ F28D 15/04; F28D 15/025; F28D 15/02; F28D 15/0233; F28D 15/046; H05K 7/20336
See application file for complete search history.

(56) References Cited

U.S. PATENT DOCUMENTS 6,269,866 B1 * 8/2001 Yamamoto .......... F28D 15/0233
165/104.26
6,871,701 B2 * 3/2005 Ueki ................... F28D 15/0233
165/104.26
(Continued)

FOREIGN PATENT DOCUMENTS

CN 101614499 A 12/2009
CN 101639331 A 2/2010
(Continued)

OTHER PUBLICATIONS

International Search Report issued in PCT/JP2017/017076, dated Aug. 1, 2017.
(Continued)

*Primary Examiner* — Travis Ruby
(74) *Attorney, Agent, or Firm* — ArentFox Schiff LLP

(57) ABSTRACT

A vapor chamber that includes a housing; a pillar arranged in the housing; a working fluid sealed in the housing; and a wick arranged in the housing. The pillar has a first bottom surface and a second bottom surface, and pores therein. The first bottom surface is in contact with a first main interior surface of the housing and the second bottom surface is in contact with the wick. The first bottom surface has an area larger than an area of the second bottom surface. The pillar has a side surface connecting a periphery of the first bottom surface and a periphery of the second bottom surface. A cross-sectional area of the pillar decreases along a direction from the first bottom surface to the second bottom surface.

16 Claims, 4 Drawing Sheets

Related U.S. Application Data continuation of application No. PCT/JP2017/017076, filed on Apr. 28, 2017.

(56) References Cited

U.S. PATENT DOCUMENTS

| | | | | |
|---|---|---|---|---|
| 6,880,626 | B2* | 4/2005 | Lindemuth | B22F 7/004 165/104.26 |
| 8,243,449 | B2* | 8/2012 | Oniki | F28D 15/0266 361/700 |
| 8,534,348 | B2 | 9/2013 | Ohsawa | |
| 8,550,150 | B2* | 10/2013 | Hou | H01L 23/427 165/104.26 |
| 9,188,396 | B2 | 11/2015 | Kameoka et al. | |
| 10,408,547 | B2 | 9/2019 | Kameoka et al. | |
| 2004/0016534 | A1* | 1/2004 | Lai | H01L 23/4006 165/104.26 |
| 2004/0069455 | A1* | 4/2004 | Lindemuth | B22F 7/004 165/104.15 |
| 2004/0211549 | A1* | 10/2004 | Garner | F28D 15/0233 165/104.26 |
| 2005/0247432 | A1* | 11/2005 | Bhatti | F28F 3/04 165/80.3 |
| 2006/0098411 | A1* | 5/2006 | Lee | F28D 15/046 361/704 |
| 2007/0056711 | A1 | 3/2007 | Ohsawa | |
| 2007/0295486 | A1* | 12/2007 | Su | F28D 15/0233 165/104.26 |
| 2008/0135214 | A1 | 6/2008 | Ohsawa | |
| 2008/0174963 | A1* | 7/2008 | Chang | F28D 15/046 361/700 |
| 2009/0040726 | A1* | 2/2009 | Hoffman | F28D 15/0233 361/700 |
| 2009/0250196 | A1* | 10/2009 | Batty | F28F 21/065 165/104.26 |
| 2009/0260785 | A1 | 10/2009 | Wang et al. | |
| 2010/0065255 | A1 | 3/2010 | Liu et al. | |
| 2010/0071879 | A1* | 3/2010 | Hou | F28D 15/046 165/104.26 |
| 2010/0077615 | A1* | 4/2010 | Hou | B23P 15/26 29/890.039 |
| 2010/0155032 | A1* | 6/2010 | Wu | F28D 15/0233 165/104.26 |
| 2010/0157535 | A1* | 6/2010 | Oniki | H05K 7/20336 361/700 |
| 2010/0181048 | A1* | 7/2010 | Hwang | F28D 15/0233 165/104.26 |
| 2010/0266864 | A1* | 10/2010 | Lee | B32B 15/01 428/557 |
| 2010/0294200 | A1* | 11/2010 | Zhang | F28D 15/046 118/728 |
| 2011/0042044 | A1* | 2/2011 | Hou | F28D 15/0233 165/104.26 |
| 2011/0232876 | A1* | 9/2011 | Chang | F28D 15/0233 165/104.26 |
| 2011/0240264 | A1* | 10/2011 | Wang | F28D 15/0233 165/104.26 |
| 2012/0118537 | A1 | 5/2012 | Kameoka et al. | |
| 2012/0168435 | A1* | 7/2012 | Chen | F28D 15/04 220/6 |
| 2014/0166243 | A1* | 6/2014 | Lin | F28D 15/046 165/104.26 |
| 2014/0166244 | A1* | 6/2014 | Dai | F28D 15/0233 165/104.26 |
| 2014/0166245 | A1* | 6/2014 | Dai | F28D 15/046 165/104.26 |
| 2014/0345831 | A1* | 11/2014 | Lin | F28D 15/0233 165/104.26 |
| 2014/0345832 | A1* | 11/2014 | Lin | F28D 15/046 165/104.26 |
| 2014/0352925 | A1* | 12/2014 | Yu | H01L 23/427 165/104.26 |
| 2015/0027668 | A1* | 1/2015 | Yang | F28D 15/04 165/104.26 |
| 2016/0018165 | A1* | 1/2016 | Ahamed | F28D 15/04 165/104.26 |
| 2016/0033206 | A1 | 2/2016 | Kameoka et al. | |
| 2016/0309619 | A1* | 10/2016 | Tsai | F28F 3/12 |
| 2018/0066898 | A1* | 3/2018 | Lin | F28D 15/0233 |

FOREIGN PATENT DOCUMENTS

| | | |
|---|---|---|
| CN | 104534906 A | 4/2015 |
| JP | H11183067 A | 7/1999 |
| JP | 2001091172 A | 4/2001 |
| JP | 2002318085 A | 10/2002 |
| JP | 2007205701 A | 8/2007 |
| JP | 2008057806 A | 3/2008 |
| JP | 3156954 U | 1/2010 |
| JP | 2011043320 A | 3/2011 |
| JP | 2013245875 A | 12/2013 |
| JP | 3192121 U | 7/2014 |
| JP | 2014163615 A | 9/2014 |
| JP | 2014219150 A | 11/2014 |
| WO | 2007026833 A1 | 3/2007 |
| WO | 2008146129 A2 | 12/2008 |

OTHER PUBLICATIONS

Written Opinion of the International Searching Authority issued in PCT/JP2017/017076, dated Aug. 1, 2017.

International Search Report issued in PCT/JP2018/016937, dated Jul. 31, 2018.

Written Opinion of the International Searching Authority issued in PCT/JP2018/016937, dated Jul. 31, 2018.

* cited by examiner

VAPOR CHAMBER HAVING PILLARS WITH DECREASING CROSS-SECTIONAL AREA

CROSS REFERENCE TO RELATED APPLICATIONS

The present application is a continuation of International application No. PCT/JP2018/016937, filed Apr. 26, 2018, which claims priority to International application No. PCT/JP2017/017076, filed Apr. 28, 2017; and the present application is also a continuation of International application No. PCT/JP2017/017076, filed Apr. 28, 2017; the entire contents of each of which are incorporated herein by reference.

FIELD OF THE INVENTION

The present invention relates to a vapor chamber.

BACKGROUND OF THE INVENTION

In recent years, the amount of heat generation has increased due to increases in integration and performance of elements. Further, since the heat density has been increased along with miniaturization of products, it has become important to take measures to dissipate heat. This circumstance is especially pronounced in the field of mobile terminals, such as smartphones and tablets. In recent years, a graphite sheet and the like has often been used as a heat dissipating member. The heat transfer amount of the graphite sheet is, however, insufficient, and the use of various heat dissipating members has accordingly been considered. Among those, the use of a vapor chamber, which is a sheet-shaped heat pipe, has been particularly considered because the vapor chamber is capable of diffusing heat very effectively.

A vapor chamber generally has a capillary structure, which is called wick, on the inner wall of a housing to reflux a working fluid. On the wick, in general, supports for supporting the housing from the inside are arranged. This prevents the housing from being deformed due to a reduction in pressure and prevents the housing from being deformed due to external force, for example, contact with another component.

Patent Document 1 describes a heat plate including two cover plates 20 and 21, pillar-shaped supporting structures 110, and a working fluid. In Patent Document 1, a wick structure is formed on the inner side of each of the two cover plates 20 and 21, and the two cover plates 20 and 21 are supported by the supporting structures 110 from the inside. With such a configuration, two-dimensional heat diffusion is achieved.

Patent Document 1: U.S. Patent Application Publication No. 2009/0260785

SUMMARY OF THE INVENTION

With the wick structure formed on each side of the supporting structures 110 as in Patent Document 1, a working fluid being liquid can be refluxed efficiently. However, the wick structure provided on each side of the supporting structures 110 narrows a portion through which the working fluid being gas moves, and hence there is a concern that the vapor chamber has an increased thermal resistance and a reduced heat transfer capability.

The present invention has been made in view of the above-mentioned problems, and it is an object of the present invention to provide a vapor chamber that has a wide portion through which a working fluid that has become gas moves, and thus has an excellent heat transfer capability.

In order to solve the above-mentioned problems, according to an aspect of the present invention, there is provided a vapor chamber including: a housing; a pillar arranged in the housing; a working fluid sealed in the housing; and a wick arranged in the housing. The pillar has a pillar shape having a first bottom surface and a second bottom surface, and pores in a surface of the pillar. The first bottom surface is in contact with a first main interior surface of the housing while the second bottom surface is in contact with the wick. The first bottom surface has an area larger than an area of the second bottom surface.

Further, in the vapor chamber of an embodiment, the pillar has a side surface that connects a periphery of the first bottom surface and a periphery of the second bottom surface. A cross-sectional area that is perpendicular to an axis extending in a direction of a height of the pillar is reduced along the axis in the direction of the height of the pillar from a side of the first bottom surface to a side of the second bottom surface.

Further, in the vapor chamber of an embodiment, the pillar has a substantially frustum shape.

Further, in the vapor chamber of an embodiment, the pillar is a porous body.

Further, in the vapor chamber of an embodiment, the pillar is a porous body having a porosity of 1% to 20%.

Further, in the vapor chamber of an embodiment, the pillar is a porous body having an average pore diameter of 1 μm to 50 μm.

Further, in the vapor chamber of an embodiment, the housing includes two opposite members each having respective outer edge portions sealed together, and the respective outer edge portions sealed together are positioned on a side of the wick with respect to a middle of a height of the housing.

Further, in the vapor chamber of an embodiment, the vapor chamber includes a plurality of pillars, each of which is placed in the housing so as to be in contact with the main interior surface of the housing, and each of which having different heights.

Further, in the vapor chamber of an embodiment, a protruding portion is formed on a second main interior surface of the housing that is opposite to the first main interior surface of the housing.

Further, in the vapor chamber of an embodiment described above, the protruding portion has a height of 1 μm to 100 μm.

Further, in the vapor chamber of an embodiment, a ratio of a joint area between the first bottom surface and the housing to an area of the first bottom surface is 0.5 to 1.

In addition, according to the present invention, there is provided a heat dissipation device including the vapor chamber of the present invention.

In addition, according to the present invention, there is provided electronic equipment including: the vapor chamber of the present invention; or the heat dissipation device of the present invention.

According to the present invention, the vapor chamber capable of efficiently refluxing a working fluid without narrowing a portion through which the working fluid that has become gas moves is provided.

DETAILED DESCRIPTION OF PREFERRED EMBODIMENTS OF THE INVENTION

Figure 1:
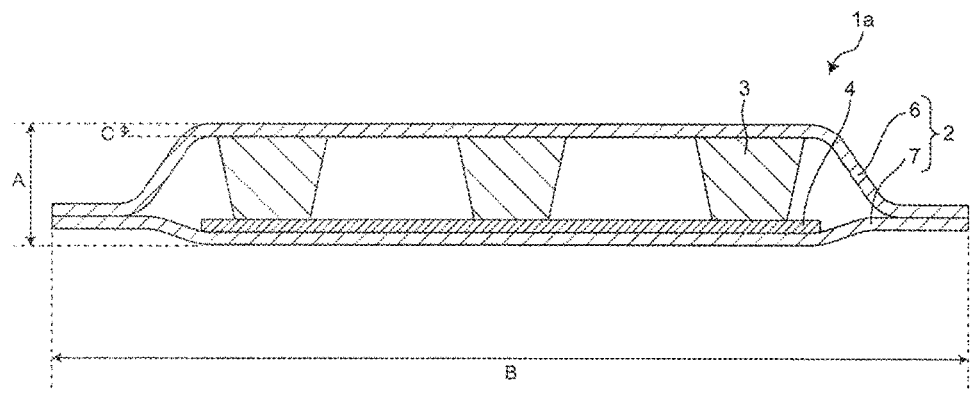
FIG. 1 is a sectional view of a vapor chamber according to an embodiment of the present invention.

The present invention will now be described in detail with reference to the drawings.

In Patent Document 1, when the wick structure on the inner side of one of the cover plates is removed in order to secure a space through which the gas stage of the working fluid moves (hereinafter also referred to as "steam channel"), the wettability of the inner surface of the cover plate in question is reduced. With the reduction in wettability, droplets are formed on the inner surface of the cover plate, and the droplets block the steam channel, resulting in a reduction in heat transfer capability of the heat plate, which is a problem. The inventors of the present application had found this problem, and as a result of a keen examination for solving the problem, the inventors of the present application have found that the problem can be solved with the following configuration: a vapor chamber that includes a housing 2, a pillar 3 that is arranged in the housing 2, a working fluid sealed in the housing 2, and a wick 4 in the housing 2; the pillar 3 provided inside the housing 2 has a pillar shape having a first bottom surface in contact with the housing 2 and a second bottom surface in contact with the wick 4, and pores in a surface of the pillar shape; and the first bottom surface has an area larger than an area of the second bottom surface. The inventors of the present application have also found that a tolerance effect for a load acting on the housing 2 is effectively exerted when the pillar 3 has a side surface that connects a periphery of the first bottom surface and a periphery of the second bottom surface, and a cross-sectional area that is perpendicular to an axis in a direction of a height of the pillar 3 is reduced along the axis in the direction of the height of the pillar 3 from a side of the first bottom surface to a side of the second bottom surface.

In the present invention, the first bottom surface of the pillar 3 is in contact with the main interior surface of the housing 2 while the second bottom surface thereof is in contact with the wick 4, and the wick 4 is not provided on the first bottom surface side. As a result, as compared to the vapor chamber having the structure in which the wick 4 is provided to each side of the pillar-shaped portions of the two bottom surfaces as in Patent Document 1, a portion through which the working fluid that has become gas moves can be larger.

In addition, in the present invention, the pillar 3 has the pillar shape having the pores in the surface, and the area of the first bottom surface in contact with the housing 2 is larger than the area of the second bottom surface in contact with the wick 4. Since the area of the first bottom surface in contact with the housing 2 is larger than the area of the second bottom surface in contact with the wick 4, for example, as compared to a case where the first bottom surface and the second bottom surface have the same area, the pillar 3 can come into contact with droplets formed in a wider range of the surface of the housing 2. In addition, the pillar 3 has the pores in the surface, and hence the droplets that have come into contact with the pillar 3 enter the pores in the surface of the pillar 3 by the capillary action. The droplets formed on the main interior surface of the housing 2 can be removed in this way, and a reduction in heat transfer capability of the vapor chamber due to droplets blocking a steam channel can therefore be prevented.

In addition, impurity gas that may be generated inside the vapor chamber when the vapor chamber gets hot can be suctioned by the pores in the surface of the pillar 3. Since impurity gas is suctioned by the pores of the pillar 3, the amount of impurity gas trapped in the wick 4 can be reduced, and a reduction in hydrophilicity of the wick 4 can thus be prevented, with the result that deterioration in heat conduction characteristics of the vapor chamber can be prevented.

In the following, each configuration of the vapor chamber of the present invention is described in detail.

The housing 2 of the vapor chamber of the present invention may be any component having two opposite main interior surfaces. The shape of the main interior surface of the housing 2 may be a polygon or a circle. The main interior surface as used herein means, of surfaces that define the internal space of the housing 2, a surface having the largest area and a surface opposite to the surface in question.

A height A of the housing 2 (namely, thickness of vapor chamber) that is indicated by A in FIG. 1 may be, for example, 100 µm to 600 µm, and preferably in a range from 200 µm to 500 µm inclusive. A width B of the housing 2 (namely, width of vapor chamber) that is indicated by B in FIG. 1 may be, for example, 5 mm to 500 mm, preferably in a range from 20 mm to 300 mm inclusive, and more preferably in a range from 50 mm to 200 mm inclusive. Further, although not illustrated, a depth D of the housing 2 (namely, depth of vapor chamber) that is orthogonal to the arrow indicating the width B of the housing 2 in FIG. 1 and extends from the near side to the far side of the drawing sheet may be, for example, 5 mm to 500 mm, preferably in a range from 20 mm to 300 mm inclusive, and more preferably in a range from 50 mm to 200 mm inclusive. The height A, the width B, and the depth D described above may be the same or vary depending on locations in the housing 2.

Figure 2:
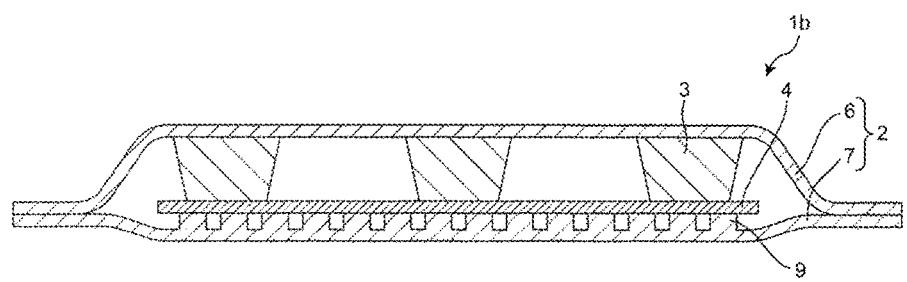
FIG. 2 is a sectional view of a vapor chamber according to an embodiment of the present invention.

The housing 2 may be formed of a single member in an integrated manner or of two opposite members, for example, sheets, having sealed outer edge portions as illustrated in FIGS. 1 and 2, for example. Further, the housing 2 may be formed of two or more plate-shaped members. In vapor chambers 1a and 1b of FIGS. 1 and 2, an upper housing sheet 6 forms the upper main interior surface of the housing 2, and a lower housing sheet 7 forms the lower main interior surface of the housing 2. In the housing 2, the upper housing sheet 6 and the lower housing sheet 7 have outer edge portions sealed with each other. The outer edge portions of the upper housing sheet 6 and the lower housing sheet 7 mean regions that extend inward by a predetermined distance from the end portion of the sheet. In the vapor chamber of FIGS. 1 and 2, the outer edge portion of the upper housing sheet 6 and the outer edge portion of the lower housing sheet 7 are joined by a brazing material to be sealed, but the method of sealing the outer edge portions is not limited thereto. Examples of the sealing method include laser welding, resistance welding, tungsten inert gas welding (TIG welding), diffusion joining, resin sealing, and ultrasonic joining.

Figure 8:
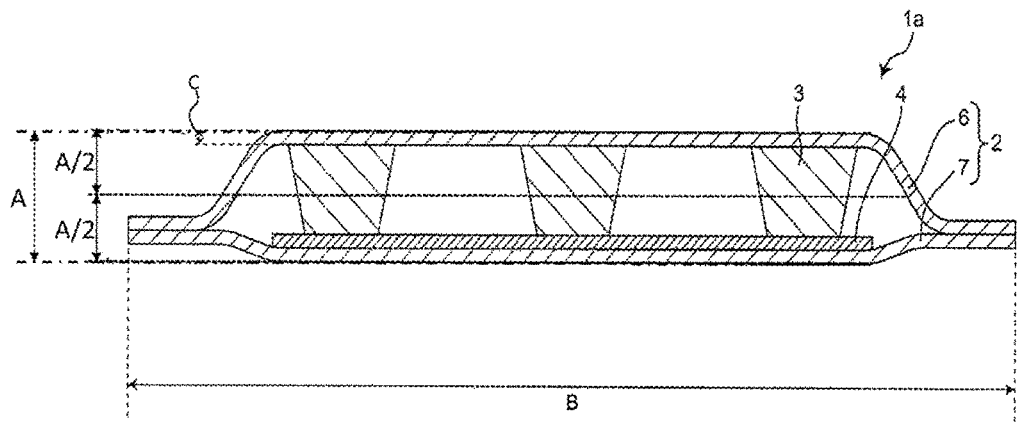
FIG. 8 is a sectional view of the vapor chamber according to an embodiment of the present invention.

As illustrated in FIG. 8, the housing 2 can include the two opposite sheets (upper housing sheet 6 and lower housing sheet 7) having the sealed outer edge portions so that the sealed outer edge portions can be positioned on the side of the wick 4 with respect to the middle of the height A of the housing 2. With such a configuration, as compared to a case where the sealed outer edge portions are positioned at the middle of the height A of the housing 2 or on the side opposite to the wick 4, a more efficient steam channel can be formed inside the vapor chamber. In particular, in the vapor chamber of the present invention, the area of the first bottom surface in contact with the housing 2 is larger than the area of the second bottom surface in contact with the wick 4, and the pillar 3 has the pores in the surface. Thus, the working fluid that has become gas near the wick 4 can be spread efficiency in a larger space, and the working fluid that has become liquid can be intensively sucked through the pores of the pillar 3. In addition, water drops generated in the steam channel can be intensively sucked via the pores of the pillar 3 so that the flow of steam can be promoted.

The material of the housing 2 is not particularly limited. Examples of the material can include metal members such as Cu, Ni, Al, Mg, Ti, and Fe, and alloy metal members containing them as their principal components. Cu and a Cu alloy are preferably used as the material.

A thickness C of the wall of the housing 2 (the thickness of the housing sheet in the example illustrated in FIG. 1) that is indicated by C in FIG. 1 may be, for example, 10 μm to 200 μm, preferably in a range from 30 μm to 100 μm inclusive, and more preferably in a range from 40 μm to 60 μm inclusive. The thickness C described above may be the same or vary depending on locations in the housing 2. For example, the thickness C of the upper housing sheet 6 and the thickness of the lower housing sheet 7 may be different from each other.

The pillars 3 are arranged in the internal space of the housing 2 so as to support the housing 2 from the inside. The pillar 3 may be fixed to the housing 2 or may not be fixed to the housing 2. With the pillars 3 arranged in the internal space of the housing 2, the amount of deformation of the housing 2 due to a load acting on the housing 2 can be reduced.

The pillar 3 has a pillar shape having the first bottom surface and the second bottom surface, and the area of the first bottom surface is larger than the area of the second bottom surface. The area of the first bottom surface as used herein means the area of a portion surrounded by the periphery of the first bottom surface, and the area of the second bottom surface as used herein means the area of a portion surrounded by the periphery of the second bottom surface. The first bottom surface of the pillar 3 is in contact with the main interior surface of the housing 2 while the second bottom surface of the pillar 3 is in contact with the wick 4. Here, since the area of the first bottom surface is larger than the area of the second bottom surface, for example, as compared to a case where the first bottom surface and the second bottom surface have the same area, the pillar 3 can come into contact with droplets formed in a wider range of the main interior surface of the housing 2.

Figure 9:
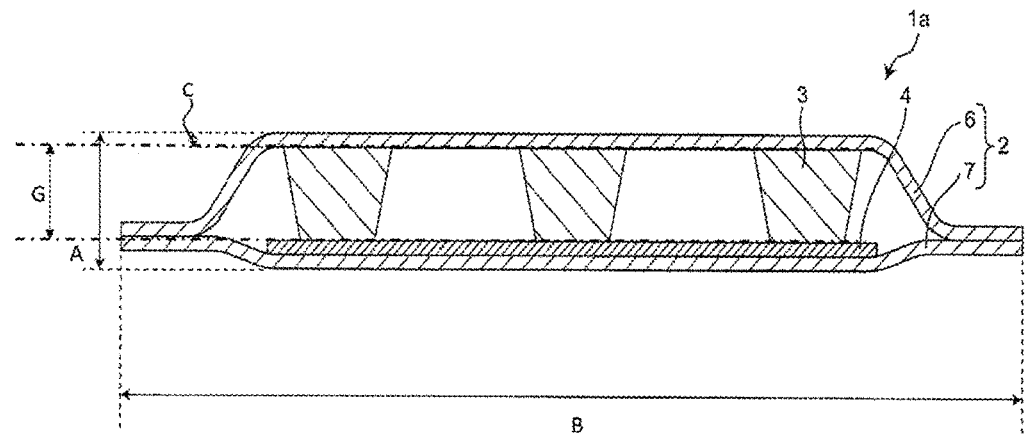
FIG. 9 is a sectional view of the vapor chamber according to an embodiment of the present invention.

The pillar 3 can be formed into any shape having the first bottom surface larger in area than the second bottom surface. For example, the pillar 3 can have a side surface that is a surface connecting the periphery of the first bottom surface and the periphery of the second bottom surface linearly in cross section, and the pillar 3 can have a shape in which a cross-sectional area that is perpendicular to the axis in the direction of a height G, indicated by G in FIG. 9, of the pillar 3 is reduced along the axis in the direction of the height G of the pillar 3 from the side of the first bottom surface to the side of the second bottom surface. "Connecting linearly" includes connecting substantially linearly with unevenness of the pores on the surface of the pillar 3 and another minute unevenness (for example, minute unevenness that may be generated in manufacturing process), for example. The "cross-sectional area that is perpendicular to axis in direction of height of pillar" means an area that is calculated with a substantially cross-sectional contour shape while, although the pillar 3 actually has the pores in the surface, unevenness due to the pores is ignored.

Figure 10:
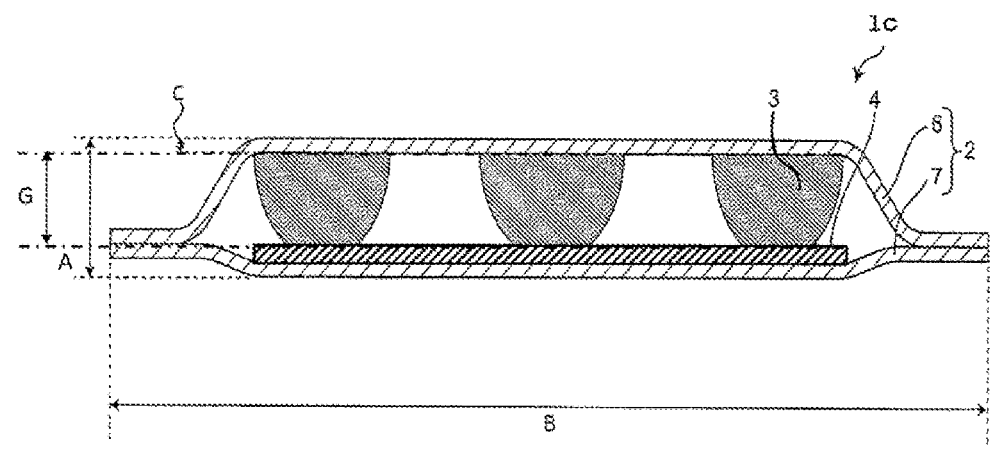
FIG. 10 is a sectional view of a vapor chamber according to another embodiment of the present invention.

Alternatively, FIG. 10 illustrates another vapor chamber 1c. For example, the pillar 3 can have a side surface that is a surface connecting the periphery of the first bottom surface and the periphery of the second bottom surface curvilinearly in cross section (for example, the pillar 3 has a bowl shape), and the pillar 3 can have a shape in which a cross-sectional area that is perpendicular to the axis in the direction of the height G, indicated by G in FIG. 10, of the pillar 3 is reduced along the axis in the direction of the height G of the pillar 3 from the side of the first bottom surface to the side of the second bottom surface. "Connecting curvilinearly" includes connecting substantially curvilinearly with unevenness of the pores on the surface of the pillar 3 and another minute unevenness (for example, minute unevenness that may be generated in manufacturing process), for example. The meaning of the "cross-sectional area that is perpendicular to axis in direction of height of pillar" is as described above. The surface curvilinearly connecting the periphery of the first bottom surface and the periphery of the second bottom surface is preferably a surface having a protrusion protruding outward from the above-mentioned surface linearly connecting the periphery of the first bottom surface and the periphery of the second bottom surface, but is not limited thereto.

In this way, with the pillar 3 having the side surface that is the surface connecting the periphery of the first bottom surface and the periphery of the second bottom surface linearly or curvilinearly in cross section, and the cross-sectional area that is perpendicular to the axis in the direction of the height G of the pillar 3 substantially reduced along the axis in the direction of the height G of the pillar 3 from the side of the first bottom surface to the side of the second bottom surface, stress that is applied on the pillar 3 when a load acts on the housing 2 can be efficiency dispersed. The surface connecting the peripheries is not limited to a straight surface or a curved surface, and may have any surface shape that is reduced in cross-sectional area perpendicular to the height axis from the side of the first bottom surface to the side of the second bottom surface. The surface may be, for example, a surface that is a combination of a straight surface and a curved surface connected to each other.

More specifically, the pillar 3 may be the pillar 3 having a side surface that is a surface linearly connecting the periphery of the first bottom surface and the periphery of the second bottom surface, that is, the pillar 3 may have a frustum shape. The pillar 3 is preferably formed into a substantially frustum shape, more preferably into a pyramidal frustum shape or a conical frustum shape, and further preferably into a conical frustum shape. With the pillar 3 formed into a substantially frustum shape, the pillar 3 hardly falls, thereby being capable of strongly supporting the housing 2 from the inside, with the result that the amount of deformation of the housing 2 due to a load acting on the housing 2 can be effectively reduced.

In addition, the pillar 3 has the pores in the surface, and hence droplets that have come into contact with the pillar 3 enter the pores in the surface of the pillar 3 by the capillary action. That is, the droplets that have come into contact with the pillar 3 are sucked by the pillar 3. The droplets formed on the main interior surface of the housing 2 can be efficiency removed in this way, and a reduction in heat transfer capability of the vapor chamber due to droplets blocking the steam channel can therefore be prevented. In consideration of these matters, in a case where the pillar 3 has the structure as described above with reference to FIG. 9 and FIG. 10, a heat diffusion effect inside the vapor chamber and a load tolerance and deformation preventing effect of the housing 2 may synergistically act, to thereby exert a favorable effect.

The structure of the pillar 3 is not particularly limited and may be any structure having pores in the surface thereof. The pillar 3 may have, for example, a structure in which the entire pillar 3 is a porous component, a structure in which pores are formed in the surface of a pillar-shaped base material, or a structure in which the surface of a pillar-shaped base material is covered with another porous material. When the structure in which the entire pillar 3 is a porous component is employed, a larger amount of the working fluid can be infiltrated into the pillar 3. Further, when the structure in which pores are formed in the surface of a pillar-shaped base material or the structure in which the surface of a pillar-shaped base material is covered with another porous material is employed, the strength of the pillar 3 can be increased. According to one aspect, the structure of the pillar 3 may be the structure in which the entire pillar 3 is a porous component. The pillar 3 having the structure in which the entire pillar 3 is a porous component may be a porous body molded to a pillar shape or a pillar-shaped base material having pores formed in the entire surface thereof. According to one aspect, the structure of the pillar 3 may be the structure in which pores are formed in the surface of a pillar-shaped base material or the structure in which the surface of a pillar-shaped base material is covered with another porous material.

The above-mentioned porous body is not particularly limited and any porous body can be used as the porous body. Examples of the porous body can include, metal porous bodies, ceramic porous bodies, resin porous bodies, metal porous sintered bodies, and ceramic porous sintered bodies.

The material of the above-mentioned base material is not particularly limited. Examples of the material include metals such as copper, aluminum, nickel, magnesium, titanium, and iron, alloys containing these metals, and resin materials.

The average porosity of the porous portion of the pillar 3 may be 1% to 20%, preferably in a range from 5% to 15% inclusive, and more preferably in a range from 7% to 13% inclusive. With the average porosity of the porous portion of the pillar 3 being 1% or more, a sufficient amount of liquid can be infiltrated into the pillar 3. With the porosity of the porous portion of the pillar 3 being 20% or less, the housing 2 can be strongly supported from the inside, and the amount of deformation of the housing 2 due to a load acting on the housing 2 can thus be effectively reduced. The porosity of the porous portion as used herein means the ratio of the total volume of the air gaps of the porous portion to the apparent volume of the porous portion, and can be measured by, for example, Archimedes' principle, mercury porosimetry, weighing porosimetry, or the gas adsorption method. For example, in the gas adsorption method, gas is physically adsorbed to a pore surface, and a pore distribution can be measured from the relationship between the adsorbed amount and relative pressure. As the above-mentioned gas, nitrogen is used in a case where the pore diameter is 0.7 nm or more. Further, through image analysis of the cross section of the pillar, the porosity can be converted. Further, with regard to the pillar 3 being a pillar-shaped base material having pores formed in the surface thereof, the porous portion means a region of the surface of the base material in which the pores are formed. Further, with regard to the pillar 3 being a pillar-shaped base material whose surface is covered with another porous material, the porous portion means a region occupied by the another porous material.

The average pore diameter of the pores of the pillar 3 may be 1 µm to 50 µm, preferably in a range from 2 µm to 30 µm inclusive, and more preferably in a range from 5 µm to 20 µm inclusive. With the average pore diameter of the pores of the pillar 3 being 1 µm or more, a sufficient amount of liquid can be infiltrated into the pillar 3. With the average pore diameter of the pores of the pillar 3 being 50 µm or less, the housing 2 can be strongly supported from the inside, and the amount of deformation of the housing 2 due to a load acting on the housing 2 can thus be effectively reduced. The average pore diameter of the pores as used herein means the diameter of a circle having the same perimeter as the average value of the cross-sectional perimeters of air gaps each having a substantially circular cross-sectional perimeter, the air gaps being observed by image analysis of five random cross sections of the pillar.

Figure 11:
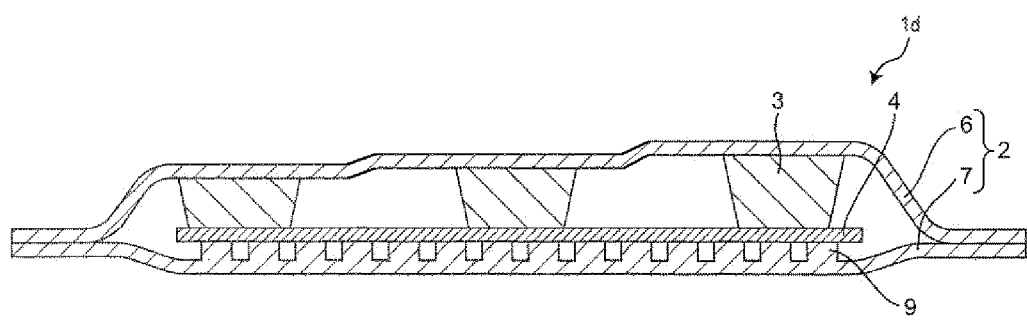
FIG. 11 is a sectional view of a vapor chamber according to yet another embodiment of the present invention.

In the vapor chamber of the present invention, a plurality of pillars 3 having different heights may be arranged (see FIG. 11, vapor chamber 1d having pillars 3 with different heights). In a case where the plurality of pillars 3 are used, the first bottom surfaces of all the pillars 3 are in contact with the housing 2 while the second bottom surfaces thereof are in contact with the wick 4. With regard to the pillars 3 having the different heights, a difference between the height of the pillar 3 having the largest height and the height of the pillar 3 having the minimum height may be in a range from 0.01 µm to 50 µm inclusive, and preferably in a range from 0.1 µm to 20 µm inclusive. In the vapor chamber of the present invention, tall pillars are preferably distributed in the center of the main interior surface. With this, the amount of deformation of the housing 2 can be effectively reduced. Further, in the vapor chamber of the present invention, a large number of tall pillars are preferably present near a portion in contact with a heat source as compared to a location far from the portion in contact with the heat source. With this, the working fluid can be effectively vaporized (boiled) near the portion in contact with the heat source.

Since the pillar 3 is formed of a material having pores formed in the surface thereof or a material having air gaps, such as a porous body, the area of a joint portion between the pillar 3 and the housing 2 is smaller than the area of the first bottom surface of the pillar 3. In a case where the pillar 3 is joined to the housing 2 to be fixed thereto, the ratio of the joint area between the first bottom surface and the housing 2 to the area of the first bottom surface may be 0.5 to 1. With the ratio of the joint area to the area of the first bottom surface being 0.5 or more, the pillar 3 is hardly deviated from its position even when receiving an impact in use, for example.

As illustrated in FIG. 2, the main interior surface of the housing 2 (namely, main interior surface of lower housing sheet 7) that is opposite to the main interior surface (namely, main interior surface of upper housing sheet 6) of the housing 2 with which the first bottom surface of the pillar 3 is in contact may have protruding portions 9.

The height of the protruding portion 9 described above is not particularly limited, but is preferably in a range from 1 µm to 100 µm inclusive, more preferably in a range from 5 µm to 50 µm inclusive, and further preferably in a range from 15 µm to 30 µm inclusive.

The protruding portions 9 may be directly formed on the main interior surface of the housing 2 as illustrated in FIG. 2. Further, the protruding portions 9 may be provided by placing, on the main interior surface, a metal foil having the protruding portions 9. With the protruding portions 9 provided, capillary force is generated in a space between the protruding portions 9, and hence the space between the protruding portions 9 may serve to reflux the working fluid. This means that, in the vapor chamber of the present invention having the protruding portions 9, the reflux of the working fluid is promoted by both the wick 4 and the space between the protruding portions 9, and efficient heat diffusion may therefore occur as compared to a vapor chamber not having the protruding portions 9. With the protruding portions 9 further formed under the pillars 3 with the wick 4 interposed therebetween, when a load acts on the housing 2, the stress can be dispersed more efficiency. Thus, according to the configuration having the protruding portions 9, as compared to the vapor chamber not having the protruding portions 9, the synergistic effect of the heat diffusion effect and the load tolerance and deformation preventing effect of the housing 2 may be more favorably exerted.

Figure 3:
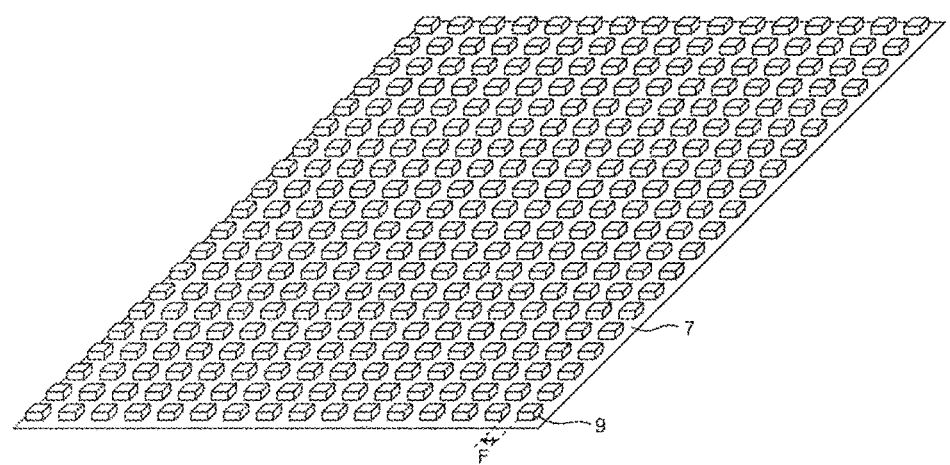
FIG. 3 is a schematic view of protruding portions on the main interior surface of the vapor chamber according to an embodiment of the present invention.
Figure 4:
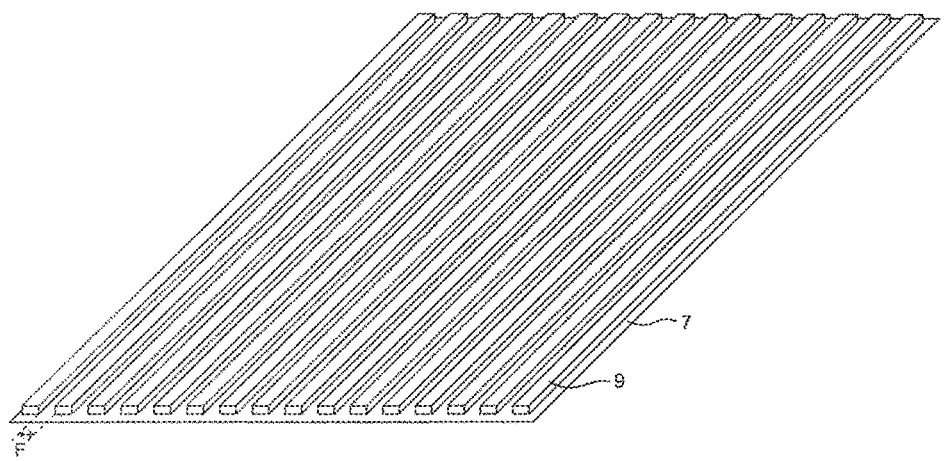
FIG. 4 is a schematic view of the protruding portions on the main interior surface of the vapor chamber according to an embodiment of the present invention.

The protruding portion 9 of the housing 2 can be formed into any shape that secures, between the adjacent protruding portions 9, a space capable of refluxing the working fluid. The protruding portion 9 of the housing 2 is preferably formed into a pillar shape having opposite bottom surfaces in parallel to each other. The protruding portion 9 of the housing 2 may have, for example, a substantially quadrangular prism shape, a substantially column shape, or a frustum shape. In a case where the protruding portion 9 of the housing 2 is formed into a substantially quadrangular prism shape, the protruding portion 9 may have a rectangular bottom surface having the ratio of a length of short side to a length of long side being about 1 as illustrated in FIG. 3. Further, as illustrated in FIG. 4, the ratio of the length of short side to the length of long side may greatly fall below 1. Further, although not illustrated, the ratio of the length of short side to the length of long side may be 1. That is, the bottom surface of the protruding portion 9 may be a square.

A distance F between the protruding portion 9 and the protruding portion 9 adjacent thereto is in a range from 1 µm to 500 µm inclusive, preferably in a range from 5 µm to 300 µm inclusive, and more preferably in a range from 15 µm to 150 µm inclusive. With the distance F falling within such a range, the working fluid can be more effectively refluxed.

The wick 4 is placed in the internal space of the housing 2 and has a role of refluxing the working fluid. How the wick 4 is placed is not particularly limited. The wick 4 may be, for example, placed so as to be sandwiched between the main interior surface of the housing 2 and the pillars 3 as illustrated in FIG. 1. Further, as illustrated in FIG. 2, the wick 4 may be placed to be sandwiched between the protruding portions 9 and the pillars 3 in the case where the protruding portions 9 are formed on the main interior surface of the housing 2 that is opposite to the main interior surface of the housing 2 with which the first bottom surface is in contact.

The thickness of the wick 4 may be, for example, in a range from 5 µm to 200 µm inclusive, preferably in a range from 10 µm to 80 µm inclusive, and more preferably in a range from 30 µm to 50 µm inclusive. The thickness of the wick 4 may be the same or vary depending on locations of the wick 4. Further, the wick 4 is not necessarily formed over the entire main interior surface of the housing 2 of the vapor chamber, and may be formed on part of the main interior surface.

The material of the wick 4 is not particularly limited. Examples of the material can include porous bodies, mesh, sintered bodies, and nonwoven fabrics. Mesh or a nonwoven fabric is preferably used as the wick 4.

Although not illustrated in FIG. 1 and FIG. 2, in the housing 2 of the vapor chamber of the present invention, the working fluid is further sealed. The working fluid vaporizes by heat from a heating element to become steam. After that, the working fluid that has become steam moves in the housing 2 to release heat, thereby returning to liquid. The working fluid that has returned to liquid is conveyed to the heat source again by the capillary action by the wick 4. The working fluid then vaporizes again by heat from the heat source to become steam. Through repetition of this, the vapor chamber of the present invention can autonomously operate without external power to diffuse heat two-dimensionally at high speed by utilizing the latent heat of evaporation or condensation of the working fluid.

The kinds of the working fluid are not particularly limited. Examples of the working fluid can include water, alcohols, and alternatives for CFCs. Water is preferably used as the working fluid.

The vapor chamber of the present invention may be mounted on a heat dissipation device so as to be located near a heat source. Thus, the present invention also provides a heat dissipation device including the vapor chamber of the present invention. With the heat dissipation device of the present invention including the vapor chamber of the present invention, a temperature rise of an electronic component generating heat and a temperature rise around the component can be effectively prevented.

The vapor chamber or the heat dissipation device of the present invention may be mounted in or on electronic equipment for the purpose of heat dissipation. Thus, the present invention provides electronic equipment including the vapor chamber or the heat dissipation device of the present invention. Examples of the electronic equipment of the present invention include smartphones, tablet terminals, laptop computers, game consoles, and wearable devices. As described above, the vapor chamber of the present invention can autonomously operate without external power to diffuse heat two-dimensionally at high speed by utilizing the latent heat of evaporation or condensation of the working fluid. Thus, with the electronic equipment including the vapor chamber or the heat dissipation device of the present invention, heat dissipation can be effectively achieved in a limited space inside the electronic equipment.

Example 1

Two Cu foils for forming the upper housing sheet 6 and the lower housing sheet 7 were first prepared. The Cu foil for forming the upper housing sheet 6 had a dimension of 100 mm long and 50 mm wide and a thickness of 50 μm. The Cu foil for forming the lower housing sheet 7 had a dimension of 100 mm long and 50 mm wide and a thickness of 50 μm. As a constituent, a metal paste that contained metal such as copper as its principal component was formed into a frustum shape with a circular bottom surface on the upper housing sheet 6. By firing this metal paste, the pillars 3 having the frustum shape with the circular bottom surface were formed on the upper housing sheet 6. In addition, the protruding portions 9 were formed by etching on the Cu foil for forming the lower housing sheet 7. An etchant used for forming the protruding portions 9 was sodium persulfate, the temperature of etching was 40° C., and the etching time was adjusted so that a predetermined shape was obtained. The wick 4 was placed so as to be sandwiched between the pillars 3 formed on the upper housing sheet 6 and the protruding portions 9 formed on the lower housing sheet 7. The outer edge portion of the upper housing sheet 6 and the outer edge portion of the lower housing sheet 7 were soldered to be sealed. In this way, the vapor chamber of the present invention was obtained. The thickness of the wick 4 used was 50 μm, and the obtained vapor chamber had the height A of 400 μm, the width B of 50 mm, and the depth D of 100 μm.

Comparative Example 1

The vapor chamber of the present invention was obtained by a method similar to that in Example 1 except that the pillars 3 were formed by etching the upper housing sheet 6. In Comparative Example 1, an etchant used for forming the pillars 3 was sodium persulfate, the temperature of etching was 40° C., and the etching time was adjusted so that a predetermined shape was obtained. The obtained pillar 3 had a column shape with a constant thickness over the length of the pillar 3.

Figure 5:
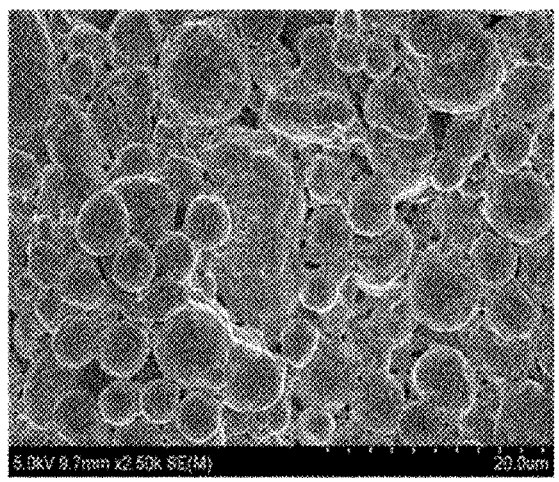
FIG. 5 is an SEM image of the surface of a pillar of Example 1.
Figure 6:
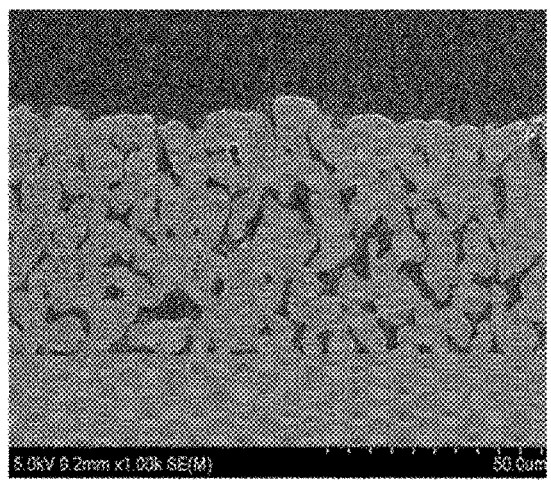
FIG. 6 is an SEM image of the cross section of the pillar of Example 1.

An SEM image of the surface of the pillar 3 of Example 1 was measured to obtain the image of FIG. 5, and an SEM image of the cross section was measured to obtain the image of FIG. 6. It was confirmed that the pillar 3 of Example 1 was a porous body having a large number of pores and air gaps.

Figure 7:
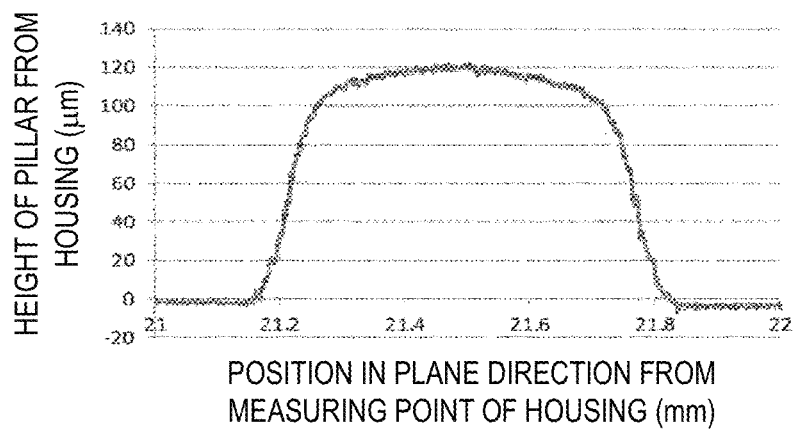
FIG. 7 is a diagram of shape measurement of the column of Example 1.

In addition, the surface shape of the surface of the upper housing sheet 6 having formed thereon the pillars 3 of Example 1 that forms the main interior surface was measured to obtain the result of FIG. 7. By this measurement, it was able to be confirmed that the pillar 3 had a height of approximately 120 μm. In addition, it was able to be confirmed that the width of the first bottom surface portion in contact with the main interior surface of the upper housing sheet 6 was larger than the width of the second bottom surface portion, which is the other bottom surface.

In the vapor chambers obtained as Example 1 and Comparative Example 1, a contact angle of a working fluid to the main interior surface with which the first bottom surface of the pillar 3 was in contact was 60°. The maximum heat transfer amount of the vapor chamber of Example 1 was 10 W while the maximum heat transfer amount of the vapor chamber obtained as Comparative Example 1 was 5 W. The reason of this is conceivable as follows: since the pillar 3 of the vapor chamber of Example 1 had the frustum shape having the pores in the surface, droplets on the main interior surface with which the first bottom surface of the pillar 3 was in contact was able to be infiltrated into the pillar 3, thereby being reduced. It is conceivable that, in the vapor chamber of Example 1, since the droplets on the main interior surface with which the first bottom surface of the pillar 3 was in contact were reduced by the pillar 3, the steam channel was prevented from being blocked by the droplets, with the result that the heat plate exhibited a high heat transfer capability.

The vapor chamber, the heat dissipation device, and the electronic equipment of the present invention can be used in a wide range of applications in the field of mobile information terminals and the like. For example, the vapor chamber and the heat dissipation device can be used to decrease the temperature of a heat source such as a CPU, to thereby extend the operating time of electronic equipment, and can be used in smartphones, tablets, laptop computers, and the like.

REFERENCE SIGNS LIST

1*a* vapor chamber
1*b* vapor chamber
1*c* vapor chamber
2 housing
3 pillar
4 wick
6 upper housing sheet
7 lower housing sheet
9 protruding portion

The invention claimed is:
1. A vapor chamber comprising:
a housing;
a pillar arranged in the housing;
a working fluid in the housing; and
a wick placed in the housing; and
a metal foil on a main interior surface of the housing, the metal foil containing a plurality of protruding portions, the metal foil being arranged such that the pillars are adjacent a surface of the plurality of protrusions opposite the main interior surface of the housing and the wick is between the pillars and the plurality of protrusions such that a space is defined between adjacent protruding portions for refluxing the working fluid, wherein
the pillar has a first bottom surface and a second bottom surface, and pores therein,
the first bottom surface is in contact with a first main interior surface of the housing and the second bottom surface is in contact with the wick,
the first bottom surface has a first area larger than a second area of the second bottom surface,
the pillar has a side surface connecting a first periphery of the first bottom surface and a second periphery of the second bottom surface,
a cross-sectional area of the pillar decreases along a direction from the first bottom surface to the second bottom surface, and
the second area of the second bottom surface is larger than an area of the surface of the plurality of protrusions opposite the main interior surface of the housing.
2. The vapor chamber according to claim 1, wherein the pillar has a frustum shape.
3. The vapor chamber according to claim 1, wherein the side surface linearly in cross section connects the first periphery of the first bottom surface and the second periphery of the second bottom surface.
4. The vapor chamber according to claim 1, wherein the side surface curvilinearly in cross section connects the first periphery of the first bottom surface and the second periphery of the second bottom surface.

5. The vapor chamber according to claim 1, wherein the pillar is a porous body.

6. The vapor chamber according to claim 5, wherein the pillar has a porosity of 1% to 20%.

7. The vapor chamber according to claim 5, wherein the pillar has an average pore diameter of 1 μm to 50 μm.

8. The vapor chamber according to claim 1, wherein
the housing includes two opposite members having their respective outer edge portions sealed to each other, and
the respective sealed outer edge portions are positioned on a side of the wick with respect to a middle of a height of the housing.

9. The vapor chamber according to claim 1, wherein the vapor chamber includes a plurality of the pillars, each of which is arranged in the housing so as to be in contact with the main interior surface of the housing, and each of which having different heights.

10. The vapor chamber according to claim 9, wherein among the plurality of the pillars having different heights, a difference between a first height of the pillar having a largest height and a second height of the pillar having a smallest height is in a range of 0.01 μm to 50 μm.

11. The vapor chamber according to claim 1, wherein the plurality of protruding portions have a height of 1 μm to 100 μm.

12. The vapor chamber according to claim 1, wherein a distance between adjacent protruding portions of the plurality of protruding portions is in a range from 1 μm to 500 μm.

13. The vapor chamber according to claim 1, wherein a ratio of a joint area between the first bottom surface and the housing to an area of the first bottom surface is 0.5 to 1.

14. A heat dissipation device comprising:
the vapor chamber according to claim 1.

15. Electronic equipment comprising:
a heat source; and
the heat dissipation device according to claim 14 positioned so as to dissipate heat generated by the heat source.

16. Electronic equipment comprising:
a heat source; and
the vapor chamber according to claim 1 positioned so as to dissipate heat generated by the heat source.

* * * * *